United States Patent
Chen

(10) Patent No.: US 8,304,789 B2
(45) Date of Patent: Nov. 6, 2012

(54) LIGHT EMITTING DIODE PACKAGE

(75) Inventor: Yi-Wen Chen, Taipei (TW)

(73) Assignee: Everlight Electronics Co., Ltd., New Taipei (TW)

( * ) Notice: Subject to any disclaimer, the term of this patent is extended or adjusted under 35 U.S.C. 154(b) by 318 days.

(21) Appl. No.: 12/691,743

(22) Filed: Jan. 22, 2010

(65) Prior Publication Data

US 2010/0187549 A1    Jul. 29, 2010

(30) Foreign Application Priority Data

Jan. 23, 2009  (TW) .............................. 98103064 A

(51) Int. Cl.
*H01L 33/00* (2010.01)

(52) U.S. Cl. ....... 257/89; 257/98; 257/99; 257/E33.056; 257/E33.067

(58) Field of Classification Search .................... 257/99, 257/89, 98, E33.056, E33.067
See application file for complete search history.

(56) References Cited

U.S. PATENT DOCUMENTS

| | | | |
|---|---|---|---|
| 6,812,498 B1 | 11/2004 | Moon | |
| 2003/0189829 A1* | 10/2003 | Shimizu et al. | 362/240 |
| 2009/0115050 A1* | 5/2009 | Kasuya et al. | 257/701 |

FOREIGN PATENT DOCUMENTS

| | | |
|---|---|---|
| CN | 1378291 | 11/2002 |
| CN | 1830085 | 9/2006 |
| CN | 101036239 | 9/2007 |
| CN | 101083213 | 12/2007 |
| CN | 201044245 | 4/2008 |
| CN | 201057438 | 5/2008 |
| CN | 201134440 | 10/2008 |
| JP | 2004-158799 | 6/2004 |
| JP | 2006339596 | 12/2006 |

OTHER PUBLICATIONS

"First Office Action of China Counterpart Application", issued on Mar. 17, 2011, p. 1-p. 5.
"Patent Gazette of China Counterpart Application", issued on Jul. 11, 2012, pp. 1-11, in which the listed references were cited.

* cited by examiner

*Primary Examiner* — Benjamin Sandvik
*Assistant Examiner* — Whitney T Moore
(74) *Attorney, Agent, or Firm* — Jianq Chyun IP Office

(57) ABSTRACT

A light emitting diode (LED) package includes a substrate, a plurality of LED chips, and a plurality of electrode pairs. The LED chips are disposed on the substrate, and each of the LED chips is electrically isolated from one another. The electrode pairs are disposed on the substrate, and each of the electrode pairs is electrically isolated from one another. The number of the electrode pairs is equal to the number of the LED chips, and each of the electrode pairs electrically connects one of the LED chips corresponding thereto.

13 Claims, 4 Drawing Sheets

US 8,304,789 B2

LIGHT EMITTING DIODE PACKAGE

CROSS-REFERENCE TO RELATED APPLICATION

This application claims the priority benefit of Taiwan application serial no. 98103064, filed on Jan. 23, 2009. The entirety of the above-mentioned patent application is hereby incorporated by reference herein and made a part of specification.

BACKGROUND OF THE INVENTION

1. Field of the Invention

The present invention relates to a light emitting diode (LED) package. More particularly, the present invention relates to an LED package having a plurality of LED chips electrically isolated from one another.

2. Description of Related Art

In an LED package, group III-V elements serve as main materials of a light emitting layer, and a current is applied to the light emitting layer. Through combination of electrons and electron holes, redundant energy is released in a form of light, thus achieving a light emitting effect. In comparison with conventional light emission through heating or discharging, the light emitted from the LED package is a type of cold emission; therefore, the service life of the LED package is rather long, and no idling time is required. In addition, the LED package has advantages of high responsive speed, small volume, little consumption of electricity, low degree of pollution (no mercury contained), great reliability, adaptation of mass production, and so on. Thus, applications of the LED package are extensive. Recently, light emitting efficiency of the LED package is continuously increasing, such that conventional fluorescent lamps and incandescent bulbs tend to be gradually replaced by a white LED package serving as a light source of a scanner, a back light source of a liquid crystal display screen, or an illuminator, for example. Common white LED packages according to the related art mainly include following types:

1. The white light is produced by using a blue LED chip and yellow fluorescent powder. Here, after the yellow inorganic fluorescent powder is irradiated by blue light emitted by the blue LED chip, yellow fluorescent light can be emitted. After the yellow fluorescent light is mixed with the original blue light, a two-wavelength-band white light can be generated. The white LED package has a plurality of blue LED chips electrically connected to one another in parallel. Nonetheless, it is difficult to perform an electrical test individually on the blue LED chips electrically connected to one another in parallel, and thereby manufacturing costs are raised. Besides, when one or more of the blue LED chips in the white LED package are damaged, a loaded current of the other blue LED chips connected in parallel to the damaged blue LED chips is increased, such that the other blue LED chips connected in parallel to the damaged blue LED chips are apt to be damaged.

2. The white light is produced by simultaneously using a red LED chip, a blue LED chip, and a green LED chip. In this kind of white LED package, a plurality of single-colored LED chips must be employed at the same time, and the single-colored LED chips exemplarily including the red LED chip, the blue LED chip, and the green LED chip are adapted to different driving voltages. Therefore, the red LED chip, the blue LED chip, and the green LED chip are connected in parallel by sharing the cathode or the anode. When one or more of the single-colored LED chips in the white LED package are damaged, a loaded current of the other single-colored LED chips connected in parallel to the damaged single-colored LED chips is increased, such that the other single-colored LED chips connected in parallel to the damaged single-colored LED chips are apt to be damaged.

SUMMARY OF THE INVENTION

The present invention is directed to an LED package of which LED chips are electrically isolated from one another.

In the present invention, an LED package including a substrate, a plurality of LED chips, and a plurality of electrode pairs is provided. The LED chips are disposed on the substrate, and each of the LED chips is electrically isolated from one another. The electrode pairs are disposed on the substrate. Each of the electrode pairs is electrically isolated from one another. The number of the electrode pairs is equal to the number of the LED chips, and each of the electrode pairs electrically connects one of the LED chips corresponding thereto.

According to an embodiment of the present invention, the LED chips include a first LED chip, a second LED chip, and a third light LED chip. The electrode pairs include a first electrode pair, a second electrode pair, and a third electrode pair. The first electrode pair is electrically connected to the first LED chip, the second electrode pair is electrically connected to the second LED chip, and the third electrode pair is electrically connected to the third LED chip.

According to an embodiment of the present invention, the first electrode pair has a first anode and a first cathode that are electrically connected to the first LED chip, the second electrode pair has a second anode and a second cathode that are electrically connected to the second LED chip, and the third electrode pair has a third anode and a third cathode that are electrically connected to the third LED chip.

According to an embodiment of the present invention, the first LED chip, the second LED chip, and the third LED chip are respectively a red LED chip, a blue LED chip, and a green LED chip.

According to an embodiment of the present invention, the first LED chip, the second LED chip, and the third LED chip emit lights in the same color.

According to an embodiment of the present invention, the first LED chip, the second LED chip, and the third LED chip all refer to a blue LED chip.

According to an embodiment of the present invention, the LED package further includes a plurality of heat conductive rods penetrating the substrate, and parts of the heat conductive rods are located below the LED chips.

According to an embodiment of the present invention, the LED package further includes a first heat conductive layer disposed between the LED chips and the substrate. Besides, the first heat conductive layer covers a first end of each of the heat conductive rods.

According to an embodiment of the present invention, the LED package further includes a second heat conductive layer disposed on a surface of the substrate away from the LED chips. Besides, the second heat conductive layer covers a second end of each of the heat conductive rods.

According to an embodiment of the present invention, the LED package further includes a heat dissipating device, and the second heat conductive layer is located between the heat dissipating device and the substrate.

According to an embodiment of the present invention, the LED package further includes a plurality of conductive through holes penetrating the substrate and electrically connected to the electrode pairs, respectively.

According to an embodiment of the present invention, the LED package further includes a reflective device disposed on the substrate. The reflective device and the substrate together form a concave, and the LED chips are disposed at a bottom of the concave.

According to an embodiment of the present invention, the LED package further includes a molding compound disposed in the concave and covering the LED chips.

In light of the foregoing, the LED chips of the present invention are electrically isolated from one another. Therefore, it is likely to perform an electrical test on individual LED chips, so as to inspect electrical quality of each of the LED chips.

In order to make the above and other features and advantages of the present invention more comprehensible, several embodiments accompanied with figures are described in detail below.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF EMBODIMENTS

Figure 1A:
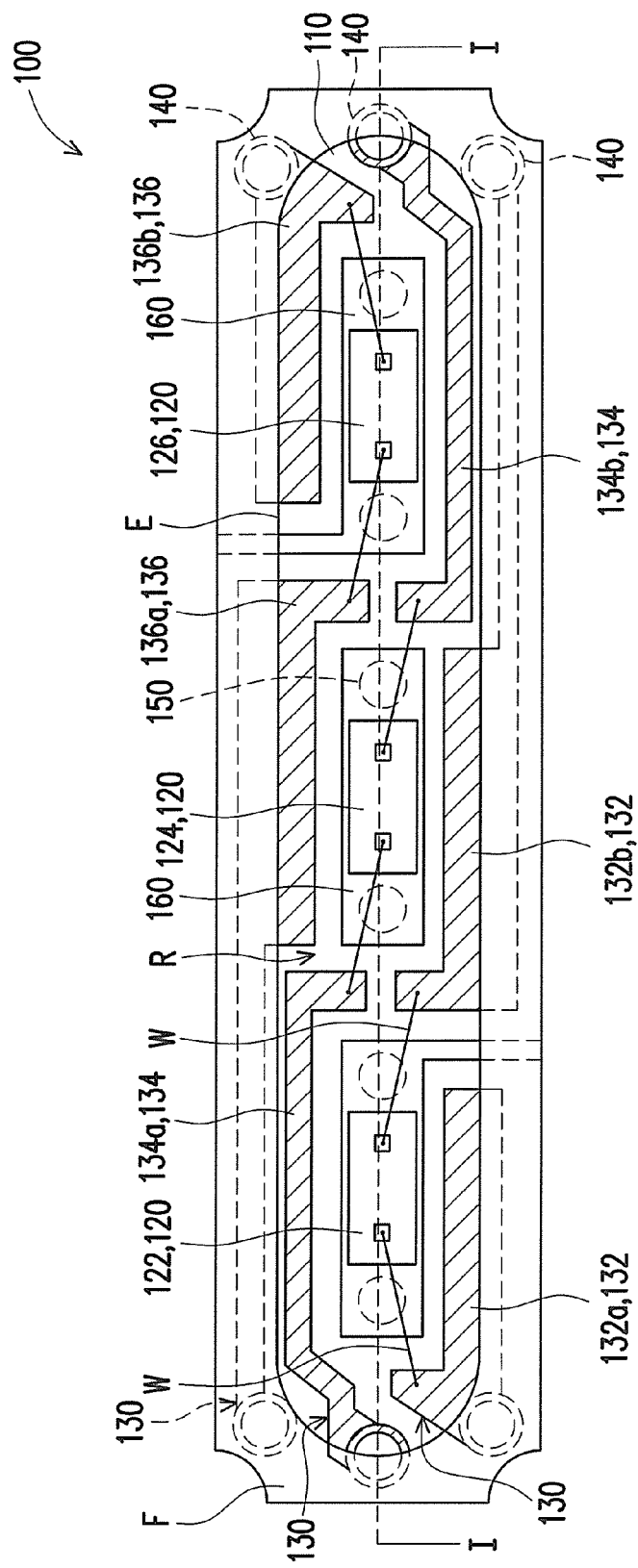
FIG. 1A is a top view of an LED package according to an embodiment of the present invention.
Figure 1B:
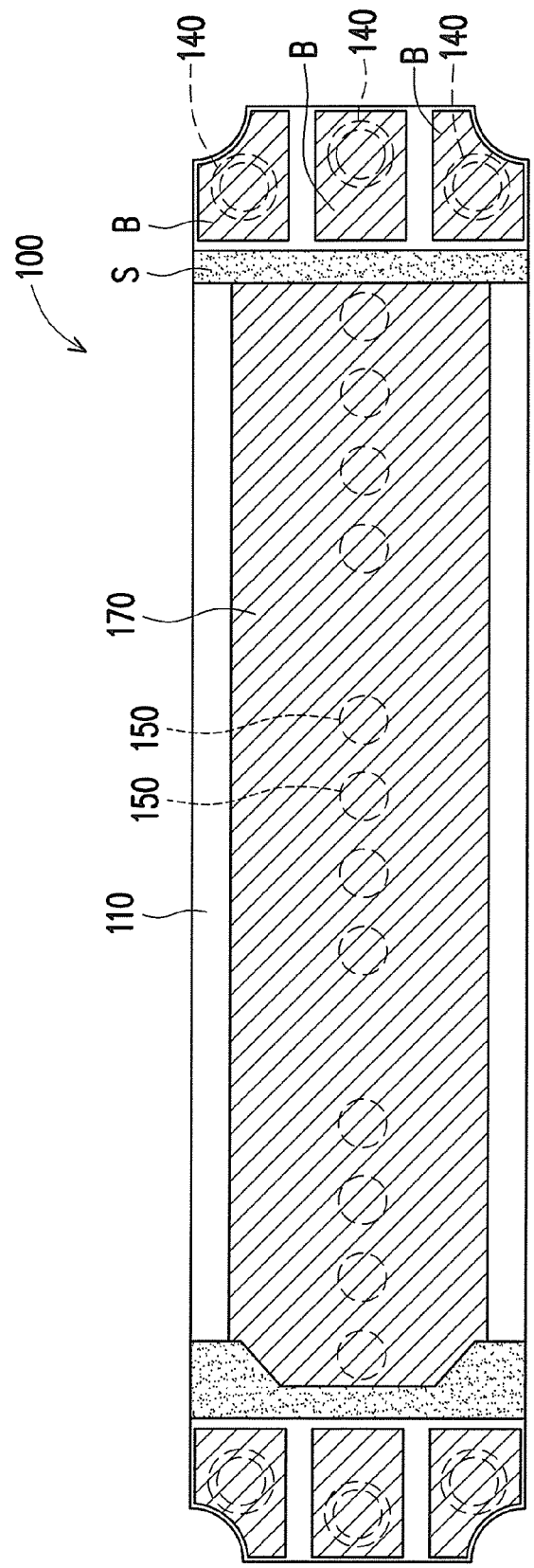
FIG. 1B is a bottom view of the LED package depicted in FIG. 1A.
Figure 1C:
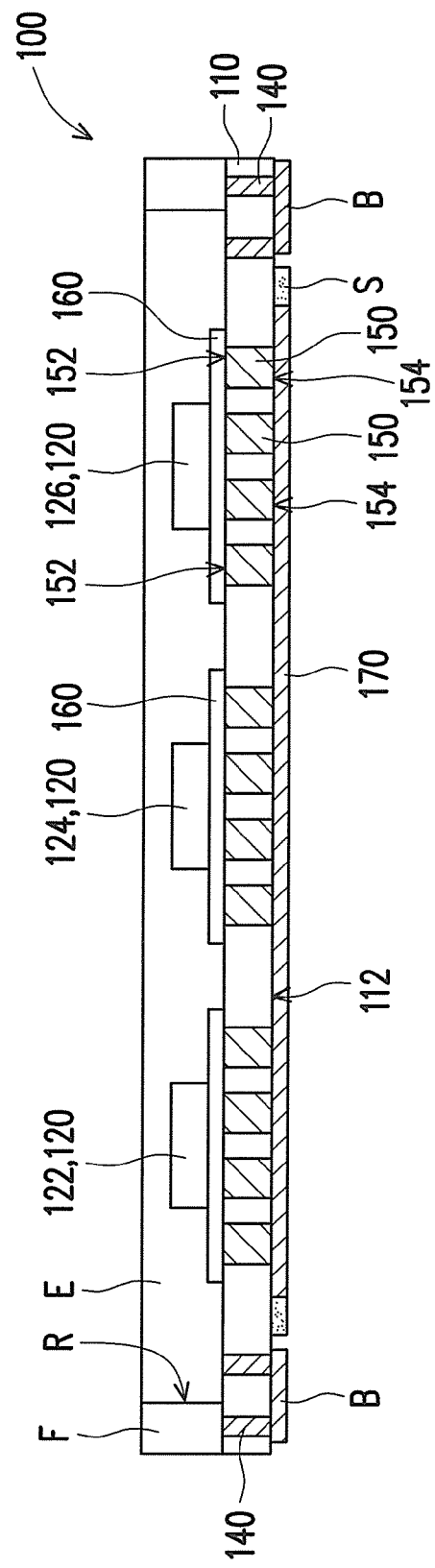
FIG. 1C is a cross-sectional view of the LED package depicted in FIG. 1A.
Figure 2:
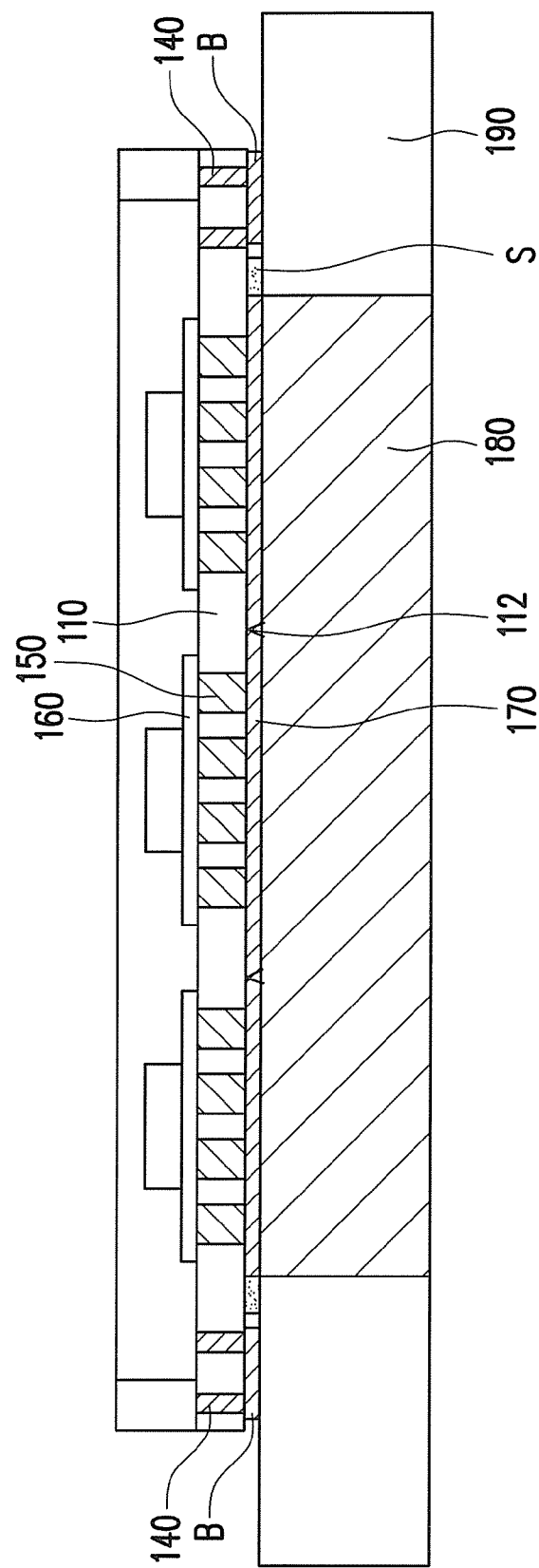
FIG. 2 is a cross-sectional view of an LED package according to another embodiment of the present invention.

FIG. 1A is a top view of an LED package according to an embodiment of the present invention. FIG. 1B is a bottom view of the LED package depicted in FIG. 1A. FIG. 1C is a cross-sectional view of the LED package depicted in FIG. 1A. FIG. 2 is a cross-sectional view of an LED package according to another embodiment of the present invention. Referring to FIG. 1A, the LED package 100 of the present embodiment includes a substrate 110, a plurality of LED chips 120, and a plurality of electrode pairs 130. The LED chips 120 are disposed on the substrate 110, and each of the LED chips 120 is electrically isolated from one another. The substrate 110 can be an insulation substrate (e.g. a ceramic substrate).

In the present embodiment, the LED chips 120 include a first LED chip 122, a second LED chip 124, and a third LED chip 126. Note that three LED chips 122, 124, and 126 serve to exemplify the invention in the present embodiment, which should not be construed as a limitation to the present invention. For instance, the number of the LED chips 120 can be two, three, or more.

According to the present embodiment, the first LED chip 122, the second LED chip 124, and the third LED chip 126 can respectively be a red LED chip, a blue LED chip, and a green LED chip. By contrast, in other embodiments, the first LED chip 122, the second LED chip 124, and the third LED chip 126 can all emit the same color light, e.g., the first LED chip 122, the second LED chip 124, and the third LED chip 126 can all refer to a blue LED chip.

The electrode pairs 130 are disposed on the substrate 110. Each of the electrode pairs 130 is electrically isolated from one another and is adaptable to be electrically connected to a plurality of individual power supplies. That is to say, each of the individual power supplies is electrically connected to one of the electrode pairs 130 exclusively. The number of the electrode pairs 130 is the same as the number of the LED chips 120. Additionally, each of the electrode pairs 130 is electrically connected to one of the LED chips 120 corresponding thereto through wire bonding, for example.

Unlike the conventional LED chips connected in parallel, the LED chips 120 of the present embodiment are electrically isolated from one another, and therefore an electrical test can be respectively performed on each of the LED chips 120. Thereby, electrical quality of each of the LED chips 120 can be inspected. Besides, when one or more of the LED chips 120 in the LED package 100 are damaged, other LED chips 120 are not affected.

Moreover, in the present embodiment, the amount of current respectively input into the first LED chip 122, the second LED chip 124, and the third LED chip 126 can be individually controlled, so as to determine luminance of the LED chips 122, 124, and 126. Besides, by individually changing the luminance of the first LED chip 122, the second LED chip 124, and the third LED chip 126, the color of light beams which are emitted from the LED package 100 can be changed. Therefore, in comparison with the conventional LED package which can merely emit the single-colored light (e.g. white light), the LED package 100 of the present embodiment can determine the color of light beams emitted therefrom based on actual demands.

According to the present embodiment, the electrode pairs 130 include a first electrode pair 132, a second electrode pair 134, and a third electrode pair 136. The first electrode pair 132 is electrically connected to the first LED chip 122, the second electrode pair 134 is electrically connected to the second LED chip 124, and the third electrode pair 136 is electrically connected to the third LED chip 126.

To be more specific, in the present embodiment, the first electrode pair 132 has a first anode 132a and a first cathode 132b that are electrically connected to the first LED chip 122. The second electrode pair 134 has a second anode 134a and a second cathode 134b that are electrically connected to the second LED chip 124. The third electrode pair 136 has a third anode 136a and a third cathode 136b that are electrically connected to the third LED chip 126.

Referring to FIGS. 1A, 1B, and 1C, in the present embodiment, a plurality of conductive through holes 140 penetrate the substrate 110. Additionally, the conductive through holes 140 are electrically connected to the first anode 132a and the first cathode 132b of the first electrode pair 132, the second anode 134a and the second cathode 134b of the second electrode pair 134, and the third anode 136a and the third cathode 136b of the third electrode pair 136, respectively. It should be noted that the conductive through holes 140 connected to different electrode pairs 130 are electrically isolated from one another.

In the present embodiment, the LED package 100 can transmit heat energy generated by the first LED chip 122, the second LED chip 124, and the third LED chip 126 to external surroundings through a plurality of heat conductive rods 150 penetrating the substrate 110. Thereby, heat dissipating capacity of the LED package 100 is improved. In particular, according to the present embodiment, some of the heat conductive rods 150 are located below the LED chips 120. The heat conductive rods 150 are made of silver, copper, or any other metal characterized by favorable heat conductivity, for example.

Moreover, in the present embodiment, a first heat conductive layer 160 can be disposed between the LED chips 120 and the substrate 110, and the first heat conductive layer 160 covers a first end 152 of each of the heat conductive rods 150, such that the heat energy generated by the LED chips 120 can be evenly transmitted to the heat conductive rods 150. The first heat conductive layer 160 is made of silver, copper, or any other metal characterized by favorable heat conductivity, for example.

To improve the aforesaid heat-transmitting efficiency of the heat conductive rods 150, a second heat conductive layer 170 can be disposed on a surface 112 of the substrate 110 away from the LED chips 120, and the second heat conductive layer 170 covers a second end 154 of each of the heat conductive rods 150. As such, the second heat conductive layer 170 gives rise to an increase in a heat dissipating area of the LED package 100, and the heat dissipating capacity of the LED package 100 is further improved. The second heat conductive layer 170 is made of silver, copper, or any other metal characterized by favorable heat conductivity, for example.

Besides, referring to FIG. 2, the substrate 110 can be disposed on a heat dissipating device 180, such that the second heat conductive layer 170 is disposed between the heat dissipating device 180 and the substrate 110. Therefore, the aforesaid heat energy can be transmitted to external surroundings sequentially through the first heat conductive layer 160, the heat conductive rods 150, the second heat conductive layer 170, and the heat dissipating device 180. Moreover, a circuit board 190 can be disposed around the heat dissipating device 180, and the conductive through holes 140 can be electrically connected to the circuit board 190 through a plurality of bonding pads B and a plurality of solder materials (not shown) between the bonding pads B and the circuit board 190. On the other hand, a solder mask layer S located between the bonding pads B and the second heat conductive layer 170 can be disposed on the surface 112 of the substrate 110, so as to prevent the solder material from overflowing to the second heat conductive layer 170 during a soldering process.

Referring to FIGS. 1A and 1C, in the present embodiment, a reflective device F can be disposed on the substrate 110, and the reflective device F and the substrate 110 together form a concave R. The LED chips 120 are disposed at a bottom of the concave R. To protect the LED chips 120 and a plurality of wires W electrically connecting the LED chips 120 and the electrode pairs 130, a molding compound E can be disposed in the concave R for covering the LED chips 120 and the wires W. The molding compound E is, for example, made of silica gel or epoxy resin.

Besides, in other embodiments, when all the LED chips 120 are the blue LED chips, fluorescent powder and the blue LED chips can be packaged into the molding compound E, so as to generate white light. The aforesaid fluorescent powder is adapted to be excited by parts of the blue light emitted by the blue LED chips, so as to emit yellow light.

To sum up, the LED chips of the present invention are electrically isolated from one another. Therefore, it is likely to perform an electrical test on individual LED chips, so as to inspect electrical quality of each of the LED chips. Moreover, when one or more of the LED chips in the LED package are damaged, other LED chips are not affected thereby. Further, the LED chips of the present invention are electrically isolated from each other, and therefore it is likely to control the amount of current inputting into each of the LED chips. As such, when the LED chip package has two or more LED chips emitting light beams having different colors, the colors of the light beams emitted by the LED package can be changed based on actual demands.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A light emitting diode package, comprising:
   a substrate;
   a plurality of light emitting diode chips disposed on the substrate, each of the light emitting diode chips being electrically isolated from one another, wherein each of the light emitting diode chips has two electrode portions isolated from each other; and
   a plurality of electrode pairs disposed on the substrate, each of the electrode pairs being electrically isolated from one another, wherein the number of the electrode pairs is equal to the number of the light emitting diode chips, and each of the electrode pairs electrically connects the two electrode portions of one of the light emitting diode chips corresponding thereto.

2. The light emitting diode package as claimed in claim 1, the light emitting diode chips comprising a first light emitting diode chip, a second light emitting diode chip, and a third light emitting diode chip, the electrode pairs comprising a first electrode pair, a second electrode pair, and a third electrode pair, wherein the first electrode pair is electrically connected to the first light emitting diode chip, the second electrode pair is electrically connected to the second light emitting diode chip, and the third electrode pair is electrically connected to the third light emitting diode chip.

3. The light emitting diode package as claimed in claim 2, wherein the first electrode pair has a first anode and a first cathode which are electrically connected to the first light emitting diode chip, the second electrode pair has a second anode and a second cathode which are electrically connected to the second light emitting diode chip, and the third electrode pair has a third anode and a third cathode which are electrically connected to the third light emitting diode chip.

4. The light emitting diode package as claimed in claim 2, wherein the first light emitting diode chip, the second light emitting diode chip, and the third light emitting diode chip are respectively a red light emitting diode chip, a blue light emitting diode chip, and a green light emitting diode chip.

5. The light emitting diode package as claimed in claim 2, wherein the first light emitting diode chip, the second light emitting diode chip, and the third light emitting diode chip emit lights in the same color.

6. The light emitting diode package as claimed in claim 5, wherein the first light emitting diode chip, the second light emitting diode chip, and the third light emitting diode chip all refer to a blue light emitting diode chip.

7. The light emitting diode package as claimed in claim 1, further comprising:
   a plurality of heat conductive rods penetrating the substrate, parts of the heat conductive rods being located below the light emitting diode chips.

8. The light emitting diode package as claimed in claim 7, further comprising:
   a first heat conductive layer disposed between the light emitting diode chips and the substrate and covering a first end of each of the heat conductive rods.

9. The light emitting diode package as claimed in claim 8, further comprising:
   a second heat conductive layer disposed on a surface of the substrate away from the light emitting diode chips and covering a second end of each of the heat conductive rods.

10. The light emitting diode package as claimed in claim 9, further comprising:

a heat dissipating device, wherein the second heat conductive layer is located between the heat dissipating device and the substrate.

11. The light emitting diode package as claimed in claim 1, further comprising:

a plurality of conductive through holes penetrating the substrate and electrically connected to the electrode pairs, respectively.

12. The light emitting diode package as claimed in claim 1, further comprising:

a reflective device disposed on the substrate, wherein the reflective device and the substrate together form a concave, and the light emitting diode chips are disposed at a bottom of the concave.

13. The light emitting diode package as claimed in claim 12, further comprising:

a molding compound disposed in the concave and covering the light emitting diode chips.

* * * * *